United States Patent
Afzali-Ardakani et al.

(10) Patent No.: US 10,103,111 B2
(45) Date of Patent: Oct. 16, 2018

(54) SEMICONDUCTOR CHIP HAVING TAMPERING FEATURE

(71) Applicant: International Business Machines Corporation, Armonk, NY (US)

(72) Inventors: Ali Afzali-Ardakani, Ossining, NY (US); Joel P. de Souza, Putnam Valley, NY (US); Bahman Hekmatshoartabari, White Plains, NY (US); Daniel M. Kuchta, Patterson, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/390,654

(22) Filed: Dec. 26, 2016

(65) Prior Publication Data

US 2017/0117237 A1   Apr. 27, 2017

Related U.S. Application Data

(62) Division of application No. 14/924,696, filed on Oct. 27, 2015, now Pat. No. 9,553,056.

(51) Int. Cl.
   *H01L 29/04* (2006.01)
   *H01L 23/00* (2006.01)
   (Continued)

(52) U.S. Cl.
   CPC ........ *H01L 23/573* (2013.01); *H01L 31/0203* (2013.01); *H01L 31/024* (2013.01);
   (Continued)

(58) Field of Classification Search
   CPC ........ H01L 2924/0002; H01L 2924/00; H01L 21/6836; H01L 21/84; H01L 2221/68327;
   (Continued)

(56) References Cited

U.S. PATENT DOCUMENTS 5,053,992 A    10/1991  Gilbert
5,883,429 A  *  3/1999  Houdeau ............ G06K 19/073
                                                  257/629
(Continued)

FOREIGN PATENT DOCUMENTS

CN      104268487        1/2015
EP       1067496 A2      1/2001
(Continued)

OTHER PUBLICATIONS

Bahman Hekmatshoar, Normally-Off Thin-Film Silicon Heterojunction Field-Effect Transistors and Application to Complementary Circuits, IEEE Electron Device Letters, vol. 35, No. 5, May 2014, pp. 545-547.

(Continued)

*Primary Examiner* — Mohammed Shamsuzzaman
(74) *Attorney, Agent, or Firm* — L. Jeffrey Kelly; Otterstedt, Ellenbogen & Kammer, LLP

(57) ABSTRACT

Silicon-based or other electronic circuitry is dissolved or otherwise disabled by reactive materials within a semiconductor chip should the chip or a device containing the chip be subjected to tampering. Triggering circuits containing normally-OFF heterojunction field-effect photo-transistors are configured to cause reactions of the reactive materials within the chips upon exposure to light. The normally-OFF heterojunction field-effect photo-transistors can be fabricated during back-end-of-line processing through the use of polysilicon channel material, amorphous hydrogenated silicon gate contacts, hydrogenated crystalline silicon source/drain contacts, or other materials that allow processing at low temperatures.

9 Claims, 12 Drawing Sheets

(51) Int. Cl.
*H01L 31/0203* (2014.01)
*H01L 31/02* (2006.01)
*H01L 31/112* (2006.01)
*H01L 31/024* (2014.01)
*H01L 31/14* (2006.01)
*H01L 31/0376* (2006.01)
*H01L 31/0216* (2014.01)
*H01L 31/20* (2006.01)

(52) U.S. Cl.
CPC .. *H01L 31/02019* (2013.01); *H01L 31/02161* (2013.01); *H01L 31/03762* (2013.01); *H01L 31/1129* (2013.01); *H01L 31/143* (2013.01); *H01L 31/202* (2013.01)

(58) Field of Classification Search
CPC ..... H01L 23/57; H01L 23/573; H01L 23/576; H01L 27/1203; H01L 27/1218; H01L 27/1262; H01L 27/1266; H01L 31/1129; H01L 31/143; H01L 31/202; H01L 31/024; H01L 31/0203; H01L 31/02161; H01L 31/03762
USPC ......... 257/187, 615, 40, 351, 290, 350, 704, 257/417, 53; 438/127
See application file for complete search history.

(56) References Cited

U.S. PATENT DOCUMENTS

| | | | |
|---|---|---|---|
| 6,141,243 A | 10/2000 | Aslam et al. | |
| 6,153,534 A | 11/2000 | Long et al. | |
| 7,880,248 B1* | 2/2011 | Pham | H01L 23/573 257/417 |
| 8,816,717 B2 | 8/2014 | Fritz et al. | |
| 9,041,079 B1* | 5/2015 | Afzali-Ardakani | G11C 13/047 257/290 |
| 9,087,210 B2 | 7/2015 | Baryudin | |
| 9,087,851 B2 | 7/2015 | Afzali-Ardakani | |
| 9,431,354 B2* | 8/2016 | Cabral, Jr. | H01L 23/576 |
| 2003/0168657 A1* | 9/2003 | Farrand | C09K 19/32 257/40 |
| 2007/0262793 A1 | 11/2007 | Kapoor | |
| 2008/0036002 A1* | 2/2008 | Kishiro | H01L 27/0288 257/350 |
| 2010/0244108 A1* | 9/2010 | Kohnke | H01L 27/14632 257/292 |
| 2011/0226148 A1 | 9/2011 | Sawka | |
| 2014/0103957 A1* | 4/2014 | Fritz | H01L 27/24 326/8 |
| 2014/0346685 A1* | 11/2014 | Afzali-Ardakani | H01L 23/576 257/787 |
| 2014/0349448 A1* | 11/2014 | Afzali-Ardakani | H01L 23/576 438/127 |
| 2015/0236282 A1* | 8/2015 | Afzali-Ardakani | H01L 27/3274 257/40 |
| 2015/0262818 A1* | 9/2015 | Cheng | H01L 21/02488 257/615 |
| 2015/0287740 A1* | 10/2015 | Bedell | H01L 29/7848 257/351 |

FOREIGN PATENT DOCUMENTS

| | | |
|---|---|---|
| JP | H03100753 | 4/1991 |
| JP | 3750430 B2 | 12/2005 |
| JP | 2014522041 A | 8/2014 |
| KR | 10-2015-0006105 | 1/2015 |

OTHER PUBLICATIONS

Ali Afzali-Ardakani et al, unpublished US Patent Application 14924696, Oct. 27, 2015, Semiconductor Chip having Tampering Feature, pp. 1-32 plus 12 sheets drawings.
Ali Afzali-Ardakani et al, unpublished US Patent Application 15390626, Dec. 26, 2016, Semiconductor Chip having Tampering Feature, pp. 1-32 plus 12 sheets drawings.
Ali Afzali-Ardakani et al, unpublished US Patent Application 15390647, Dec. 26, 2016, Semiconductor Chip having Tampering Feature, pp. 1-32 plus 12 sheets drawings.
List of IBM Patents or Patent Applications Treated As Related.

* cited by examiner

SEMICONDUCTOR CHIP HAVING TAMPERING FEATURE

CROSS-REFERENCE TO RELATED APPLICATION

This application is a division of U.S. patent application Ser. No. 14/924,696 filed Oct. 27, 2015, the complete disclosure of which is expressly incorporated herein by reference in its entirety for all purposes.

BACKGROUND

The present disclosure relates generally to the electrical, electronic and computer arts and, more particularly, to semiconductor chips that self-destruct upon exposure to light.

Silicon-based integrated circuits and other electronic devices are usually intended to function indefinitely. Certain applications, however, could possibly benefit from the ability to disable such devices should there be an attempt to tamper with them.

Thin-film heterojunction field-effect transistors (HJFETs) have been developed having crystalline silicon (c-Si) channels, amorphous hydrogenated silicon gate regions (a-Si:H) and hydrogenated crystalline silicon source and drain regions. Normally-off HJFETs are obtained by incorporating an a-Si:H blocking stack in the gate heterojunction of the HJFET devices to suppress gate leakage at forward-bias conditions. Such HJFETs have been proposed for used in the pixel circuits of AMOLED backplanes.

BRIEF SUMMARY

Techniques are provided for forming transient electronic devices wherein exposure of a heterojunction field-effect photo-transistor (PHJFET) to light is used as a trigger mechanism for destruction of an electronic chip.

In one aspect, an exemplary method of fabricating an electronic device includes obtaining a structure including a semiconductor layer and an electrically insulating layer adjoining the semiconductor layer, forming electronic circuitry on the semiconductor layer, and forming a triggering circuit including a normally-OFF heterojunction field-effect photo-transistor on the structure. A reactive layer is formed on the structure for disabling the electronic circuitry. The reactive layer is directly or indirectly reactive to current flowing through the normally-OFF heterojunction field-effect photo-transistor. The method further includes forming an encapsulation layer encapsulating the reactive layer.

In a further aspect, an exemplary integrated circuit is provided. The integrated circuit includes a structure including a semiconductor layer and an electrically insulating layer having a top surface and a bottom surface. The semiconductor layer adjoins the top surface of the electrically insulating layer and electronic circuitry is on the semiconductor layer. A triggering circuit on the structure includes a normally-OFF heterojunction field-effect photo-transistor. A reactive layer on the structure is directly or indirectly reactive to current flowing through the normally-OFF heterojunction field-effect photo-transistor for disabling the electronic circuitry.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

disablement of integrated circuits upon detection of tampering;

triggering circuit compatible with both front and back-end-of-line fabrication;

chip stability under normal operating conditions.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

DETAILED DESCRIPTION

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

Principles of the present disclosure will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a transient electronic device subject to destruction upon exposure to light. In one or more embodiments, electronic devices as described herein provide the following advantages:

fast and thorough destruction of an electronic chip;
back-end fabrication compatibility;
low-temperature fabrication feasibility;
excellent light sensitivity.

Silicon based CMOS structures are disclosed that provide for the disablement and/or elimination of the electronic systems therein upon tampering. Exemplary structures include embedded heating elements and/or light emitting elements to trigger and/or otherwise facilitate chemical reactions responsible for disabling and/or dissolving one or more major components (for example, channel material, dielectrics, and/or metal interconnects) of a chip. Mass production of the structures is highly feasible.

Figure 1:
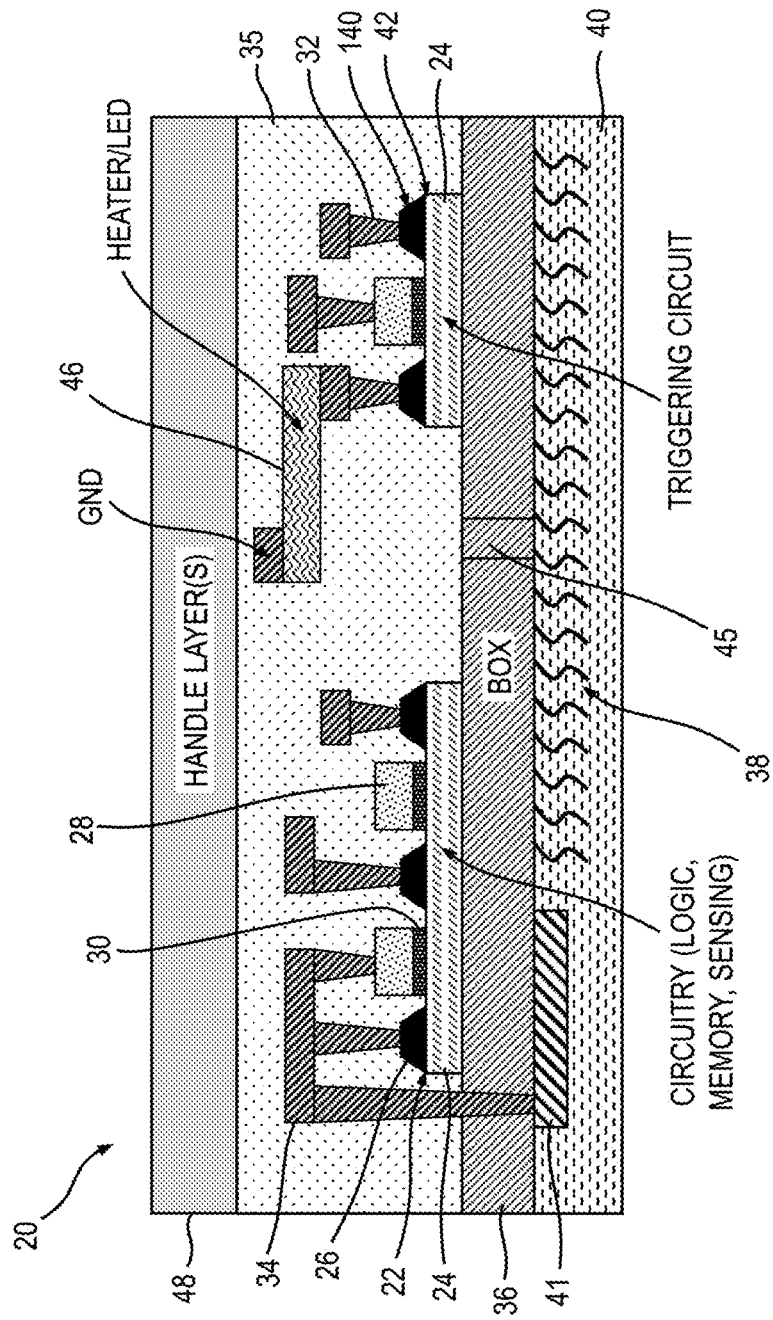
FIG. 1 is a schematic, cross-sectional view depicting a first exemplary integrated circuit.

A first exemplary structure 20 is shown in FIG. 1. The structure includes electronic circuitry 22 that, in one or more exemplary embodiments, comprises an integrated circuit (IC). In other words, the electronic circuitry may include an assembly of electronic components, fabricated as a monolithic unit, in which active and passive devices and their interconnections are formed on a thin layer 24 of semiconductor material. The resulting circuit may perform one or more functions (e.g. logic, memory, sensing) depending on the arrangement of the components. For purposes of illustration, raised source/drain regions 26, gate structures 28 and gate dielectrics 30 comprising one or more MOSFET devices are shown on the layer 24 of semiconductor material in FIG. 1. Via conductors 32 and electrical connectors 34 connect the circuit components. The via conductors 32 and electrical connectors are typically copper or aluminum. A dielectric layer 35 encases the circuitry and associated connectors. Materials such as silicon dioxide may be used to form the dielectric layer. Layer 35 and the handle layer are transparent or semitransparent to at least one wavelength of light with sufficient absorption in the semiconductor channel 24. For example, a semiconductor channel comprised of crystalline Si has a strong absorption for wavelengths of approximately 1000 nm or below. The PHJFET is shielded from light while and after being connected to a voltage source. This voltage source may be the same or a different source than the one powering up the chip. The dielectric layer and metal layers are ordinary formed during back end of line (BEOL) CMOS processing. One or more handle layers 48 adjoin the dielectric layer. An electrically insulating layer 36 such as a buried oxide (BOX) layer adjoins the circuitry layer. The insulating layer comprises silicon dioxide in one or more embodiments. A layer 38 of acid or, alternatively, base forming chemical(s) adjoins the insulating layer 36. The layer 38 is activated by heat and/or light in some embodiments, as discussed further below. An encapsulating layer 40 adjoins the chemical layer 38. The encapsulating layer employed in one or more embodiments includes a metal coating or other appropriate coating to protect the chemical layer 38 from light or other electromagnetic radiation that could cause its activation. An antenna 41 is optionally provided within the structure 20 for transmitting and/or receiving signals. The electronic circuitry 22 may be responsive to signals received by the antenna or transmit signals to an external receiver via the antenna. In one example, the disruption of a particular set of signals transmitted to the external receiver on a regular basis by the electronic circuitry 20 may indicate that the chip has been destroyed due to tampering. A via conductor is shown extending between the electronic circuitry and the antenna. The via conductor extends through the insulating layer 36. As discussed below, additional filled openings 45 or plugs may extend through the insulating (BOX) layer 36. Such conduits may, but do not necessarily have any electrical function. The BOX layer may, for example, be comprised of high-k dielectrics that usually tend to dissolve very slowly in, for example, HF. In case of multi-layer BOX layers comprising high-k materials, the plugs in some embodiments are comprised of $SiO_2$. In general, in case a reactive chemical(s) incorporated in the structure is ineffective for etching the BOX layer, plugs comprised of sacrificial material are provided that dissolve more effectively than the BOX layer itself using the provided transience chemistry. For example, the shallow trench isolation (STI) regions can serve as plugs, which provide small plugs with high density. The horizontal dimensions of the STI regions depend on the ground rules of the CMOS technology and varies from one to another. The formation of STI regions is well known to those of skill in the art of CMOS technology. STI regions could, for example, comprise silicon dioxide in some embodiments or polysilicon in other embodiments.

The structure 20 includes a triggering mechanism that comprises a triggering circuit 42 electrically connected to a heating element and/or a light emitting diode 46. Numeral 46 is employed to designate one and/or both structures, it being understood that in some embodiments only heat is capable of being generated to facilitate chemical activation, in other embodiments only light is generated for chemical activation, and that both heat and light may be generated in other embodiments. The triggering circuit in the illustrated embodiment comprises a heterojunction field-effect phototransistor (PHJFET). As discussed further below, the PHJFET is silicon-based in one or more embodiments, though non-silicon implementations of the triggering circuit are also possible. While only one heating element/LED is shown, additional heating elements, LEDs and triggering mechanisms are provided as necessary to heat and/or illuminate the chip to activate the chemical layer 38. The heating elements in some embodiments comprise filaments, e.g. titanium nitride, tantalum nitride. In some embodiments, the heating elements 46 comprise reactive materials such as nickel/aluminum or palladium/aluminum. In some embodiments, reactive materials comprising the heating elements are chosen to provide sufficient heat to destroy the chip by themselves. For example, it has been shown that Ni/Al multilayers can be ignited using relatively short, low-current electrical pulses, and thereby provide an exothermic reaction. Other reactive materials are known to the art, and the specific materials identified herein should be considered exemplary and not limiting. In such embodiments, the provision of the chemical layer 38 is optional and the dielectric layer(s) 35 functions as an encapsulation layer for the reactive materials comprising the heating element 46. An exothermic reaction is produced when a current is passed through reactive materials comprising the heating element 46. If filaments are employed as heating elements, a relatively large current is required to generate sufficient heat to activate the chemical layer 38. The current requirements for heating elements comprised of reactive materials are substantially less and may obviate the need for additional mechanisms for disabling the electronic circuit.

In normal operation, the electronic circuit 22 functions in accordance with its intended purposes and the triggering circuit 42 is inactive. While the circuit generates heat, it is not sufficient to raise the chip temperature such that the heat-sensitive chemical layer 38 and any reactive materials that may be contained in the heating element 46 are activated. The circuit 22 remains functional so long as the triggering circuit(s) does not cause the heating element(s) to raise the temperature of the chip above the threshold necessary to disable the circuit 22 and/or cause the temperature-sensitive chemical layer to react and form acid(s) and/or the lighting element(s) to cause a chemical reaction in embodiments wherein light-sensitive materials are employed. The generation of, for example, acid(s) by this layer 38 causes the circuit 22 to be at least disabled, if not entirely dissolved. The acid(s) etch the oxide and/or metal components of the circuit 22, rendering it inoperable. The PHJFET, which is normally-OFF, turns on upon exposure to light and supplies current to the heating element, which may be comprised of a reactive material such as a thin metal film stack of several metallic layers in some embodiments. If comprised of a reactive material, the reactive material may be chosen to provide sufficient heat (for example, more than one thousand degrees Centigrade (1000° C.)) to destroy the electronic circuitry by itself. The heating element, whether or not a reactive material, may also supply heat to an acid generator triggering a chemical reaction to destroy the electronic circuitry by dissolution. The reactive materials should be sufficiently proximate to the electronic circuitry that they can effectively render it unusable. The disablement of a portion of the electronic circuitry 22 is sufficient to consider the chip to be destroyed. Metal via conductors or plugs 45 comprising sacrificial material extending through the insulating (BOX) layer, as shown only in FIG. 1, facilitate etching one or more components of the circuit 22 in embodiments wherein an acid generator is employed.

In one or more alternative embodiments, the chemical layer 38 comprises a base such as potassium hydroxide (KOH). If employed, KOH should be hermetically sealed as it can absorb water and cause unwanted chip corrosion. Though not heat activated, heat facilitates its reactivity with certain chip components. KOH dissolves silicon dioxide and silicon only slowly at room temperature. Potassium hydroxide etches silicon and silicon dioxide, which is sufficient to cause the circuit 22 to be disabled. In embodiments employing a KOH chemical layer beneath the insulating layer, poly-Si plugs 45 are employed in some embodiments. If a multi-layer insulating layer is employed, silicon dioxide plugs may be employed.

In some embodiments including certain acid forming materials, exposure to light of appropriate wavelength is sufficient to cause the formation of strong acids from the chemical layer 38. Triarylsulfonium salts such as triphenylsulfonium trifluoromethanesulfonate, dispersed in a water absorbing polymer such as polyvinyl alcohol (PVA) or polyvinylpyrrolidone, are exemplary materials that can etch oxides or metals such as copper and aluminum following either exposure to light within a certain frequency range or heat above a threshold temperature. Those of skill in the art are familiar with such materials, which are used in dilute concentrations for semiconductor fabrication processes such as photolithography. As employed in the structures discussed herein, they are highly concentrated and provided in sufficient quantity such that enough material will be etched to at least disable the circuit 22. Triarylsulfonium salts are also amenable to processing that allows the activation frequency range to be adjusted in the ultraviolet (UV) range, the visible light spectrum and infrared. The structure 20 may include both heating elements and light generating elements where two modes for causing chemical reactions for disabling the circuit 22 are desired. The compound(s) comprising chemical layer 38 are stable at the normal operating temperatures of the chip with which they are associated and should also be stable at anticipated environmental temperatures. The threshold temperature for causing acid-forming reactions is between 100-200° C. in one or more exemplary embodiments. Other exemplary acid generating compounds include iodonium, phosphonium and pyridinium salts. The chemical layer 38 may include more than one type of salt in some embodiments.

In some embodiments, the mechanism for disabling at least the circuit 22 incorporated within the structure involves shattering the chip, though the structure 20 may be designed to provide both shattering and etching mechanisms. The structure 20 may include one or more compartments (not shown) that adjoin the insulating layer 36. The compartments contain chemicals that, when subject to a sufficient amount of heat, cause the generation of gases within the compartments. As the gases are substantially confined by the compartments, the pressure generated within the compartments causes them to shatter, thereby destroying the functionality of the chip. Compartments are described in U.S. Pat. No. 9,087,851, which is incorporated by reference herein.

The mechanism(s) for the disabling and/or destruction the exemplary chip structures 20 and 300 (FIG. 16) can accordingly be based on one or more of: 1) formation of strong corrosive acids from photo and/or thermal acid generators that etch oxides and/or metals, and/or 2) formation of high volumes of gases due to generation of acids in closed compartments to cause shattering of the chip, and/or 3) generation of heat within the chip sufficient to destroy all or part of the circuit 22.

The above events can simultaneously occur by a composite of acid generators in a polymer which causes the production of one or more gases. Both the acid generators and gas forming polymers are well known in the semiconductor fabrication art and in combination have been used in lithography. Examples of acid generators used in electronic industry are triarylsulfonium and diaryl iodonium salts. The gas generating polymers are also well know both as "porogens" used to form porous polymer thin films and acid sensitive polymers which lose their protecting groups to form gases. In the following equations, formation of acids and gases from aforementioned composite are illustrated.

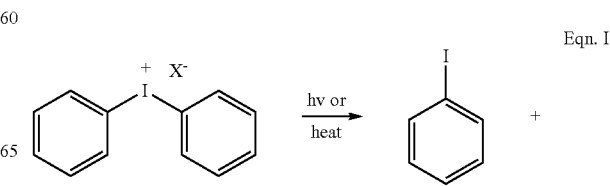

Eqn. I

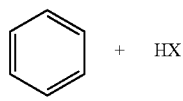 + HX

The anion X in the above equation could be chosen to form desired acids like HF, HCl CF3SO3H, H2SO4, HNO3, etc. Depending on the nature of dielectric oxide, the type of the anion and hence the acid is chosen. For example, if the dielectric layer 34 is silicon oxide, the anion in the exemplary embodiment is chosen from hexafluorophosphate (PF6) or fluoride which in both cases forms hydrofluoric acid that can dissolve silicon oxide effectively. The gas forming polymer chosen in the exemplary embodiment is one which has been extensively studied and used for positive tone resists, namely, partially protected poly(hydroxystyrene) with tert-butyloxycarbonyl (or BOC). Upon treatment with strong acids at moderately high (100-120° C.) temperatures, the BOC protecting group dissociates to one molecule of carbon dioxide and one molecule of isobutylene and leaves behind deprotected poly(hydroxystyrene) as illustrated in equation II.

Eqn. II

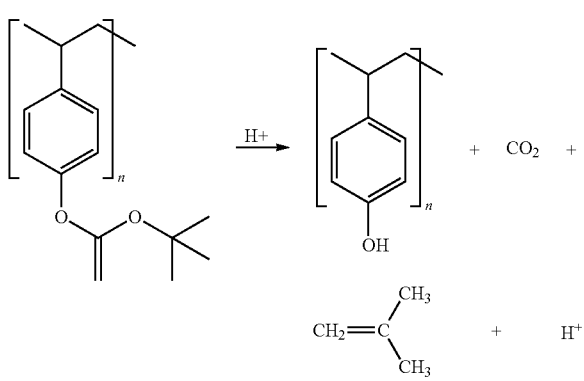

Note that in the above equation the acid is used as a catalyst and after deprotection another mole of acid is regenerated. Other exemplary acid generators include triarylsulfonium salts, which also can be used, although diaryliodonium salts have the benefit of decomposing at lower temperature (ca. 220° C.) than sulfonium salts. The polymer is used as a carrier for thin film coating of the acid generator and is used from 10% by weight to up to 90% by weight of the acid generator.

Assuming 1 mm$^2$ area for the chip, and 90% weight loading of the acid generator, each micrometer thickness of the destructive layer can generate approximately $2\times10^{-5}$ mmole of the acid in addition to $2\times10^{-5}$ mmole of each carbon dioxide and isobutylene. It is possible to produce composites containing a mixture of different acid generators to engineer the dissolution of various materials or accelerate the etch rates. For example mixture of HCl:HF provides a faster etch rate of $SiO_2$ as compared to HF alone. A combination of $HNO_3$:HF will dissolve silicon while HF alone does not etch silicon.

The specific materials discussed above should be considered exemplary as other combinations of materials may be effective for disabling or destroying the chip. Polymer composites containing inorganic porogens such as alkali azides and carbonates may be employed in some embodiments.

Figure 2:
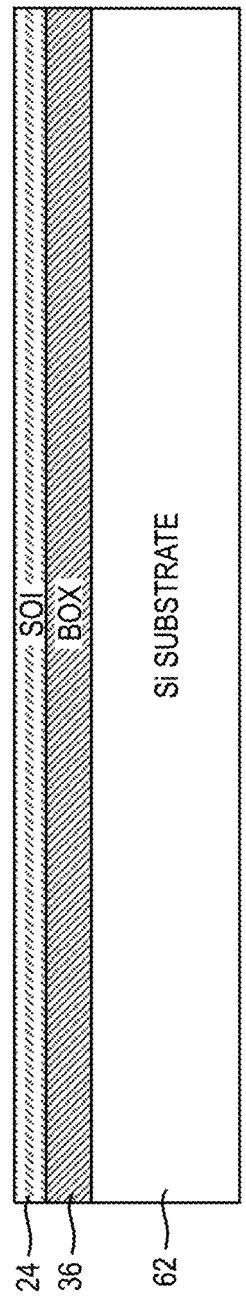
FIGS. 2-9 are schematic, cross-sectional views showing exemplary steps for fabricating the first exemplary integrated circuit.

FIGS. 2-9 schematically illustrate exemplary fabrication steps that can be employed in the manufacture of the structure 20 depicted in FIG. 1. Referring to FIG. 2, an extremely thin semiconductor on insulator (ETSOI) wafer or a semiconductor on insulator (SOI) wafer 60 is obtained. In one exemplary embodiment, the wafer 60 includes a silicon substrate 62, a buried oxide (BOX) layer 34, and a semiconductor (SOI) layer 24. The buried oxide layer comprises silicon dioxide in one or more embodiments. The semiconductor layer comprises pure monocrystalline silicon in some embodiments and polycrystalline silicon in other embodiments. As used herein, the term "crystalline" refers to single-crystalline (monocrystalline) and/or poly-crystalline (multi-crystalline) forms of a semiconductor material. Silicon germanium is an alternative semiconductor material that may be used as the semiconductor layer in other embodiments. The insulating (BOX) layer 36 has a thickness between 5 nm-3 μm, it being understood that the insulating layer 36 may comprise two or more dielectric layers, one being $SiO_2$ and another being a high-k material. SOI and ETSOI wafers are commercially available, and their fabrication is well known to those of skill in the art. The mono-crystalline silicon/poly-crystalline silicon layer 24 can be grown, for example, using chemical vapor deposition (CVD), from gaseous or liquid precursors, or deposited as an amorphous material, for example by sputtering or plasma-enhanced CVD (PECVD) and then crystallized by laser, or transferred from a bulk crystalline host using known layer transfer techniques such as SMART CUT®, controlled spalling, and epitaxial layer lift-off (ELO). Stress-induced, controlled substrate spalling is disclosed, for example, in U.S. Pat. No. 8,247,261, which is incorporated by reference herein.

Figure 4:
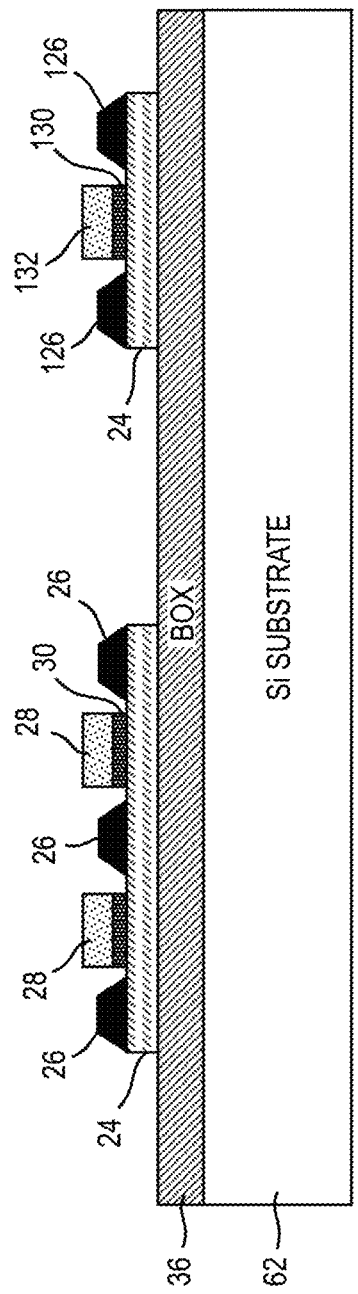

The wafer 60 is subjected to a device isolation process wherein portions of the semiconductor layer 24 are removed to form "islands" defining the device active regions as shown in FIG. 4. The areas between the active regions are filled with a dielectric material such as silicon dioxide. Openings for plugs (not shown in FIG. 2) may be formed in the insulating layer 36 following device isolation using patterning and etching techniques such as reactive ion etching (ME) familiar to those knowledgeable in the art. Referring to FIG. 4, conventional CMOS fabrication technology is employed to provide gate stack 28 and spacer 30 formation. Source/drain formation on the semiconductor layer results in raised source drain (RSD) regions 26 in one or more exemplary embodiments where MOSFET devices are to be provided in addition to the PHJFET(s) 140 in a monolithic structure. Boron doped silicon germanium RSD regions may be formed to provide pFET devices while phosphorus doped Si:C RSD regions may be formed to provide nFET devices. It will be appreciated that the circuitry layer 22 may include silicon as well as III-V materials depending on its intended function. For example, indium gallium phosphide is incorporated within some RF transistors. Chemical vapor deposition (CVD) is among the known techniques for depositing materials on silicon during CMOS fabrication. Silicide formation is employed in some embodiments to form contacts to various device electrodes. Fabrication and operation of the triggering circuit 42, including exemplary photo-HJFETs 140, 200 is described below.

Figure 5:
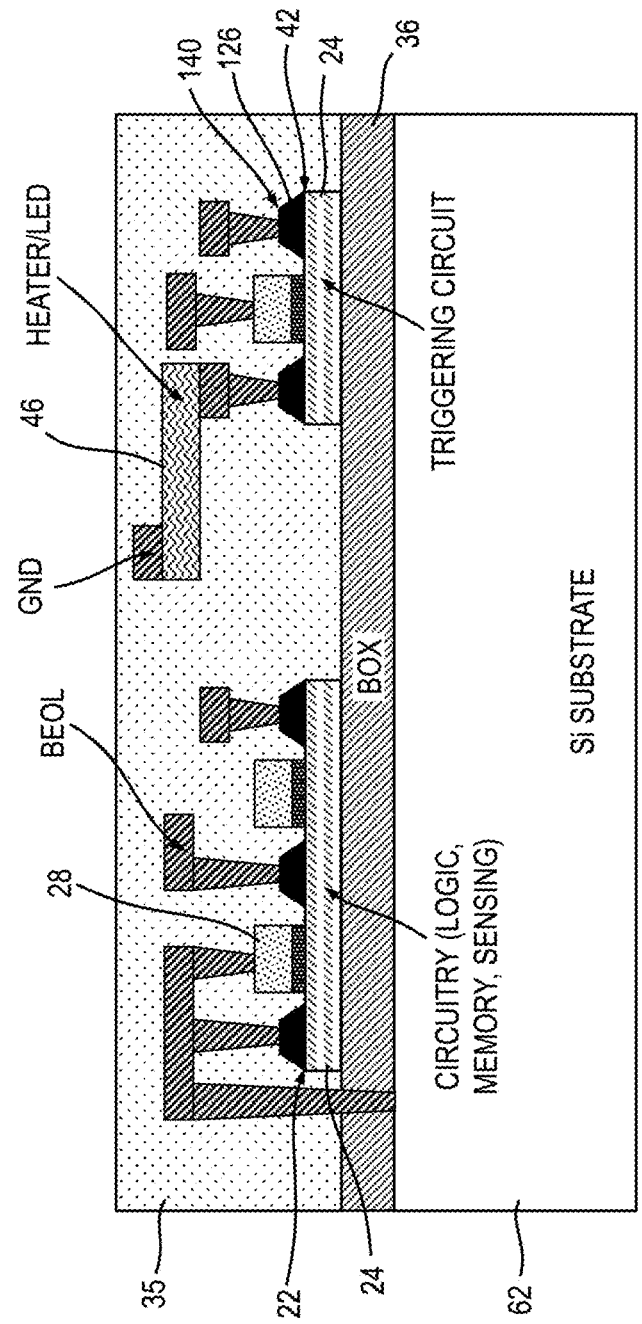

Back end of line (BEOL) processing is shown in FIG. 5 wherein the via conductors 32 and other metal layer(s), including the heating element(s), are formed within the dielectric layer 35. The triggering circuit(s) 42 is electrically connected to the heating element(s) which is, in turn, connected to ground. Additionally or alternatively, the triggering circuit(s) are connected to light emitting elements such as LEDs. Any openings formed in the BOX layer to facilitate etching of the circuit 22 upon formation of acid beneath the BOX layer are filled with appropriate materials at this stage or earlier.

Figure 6:
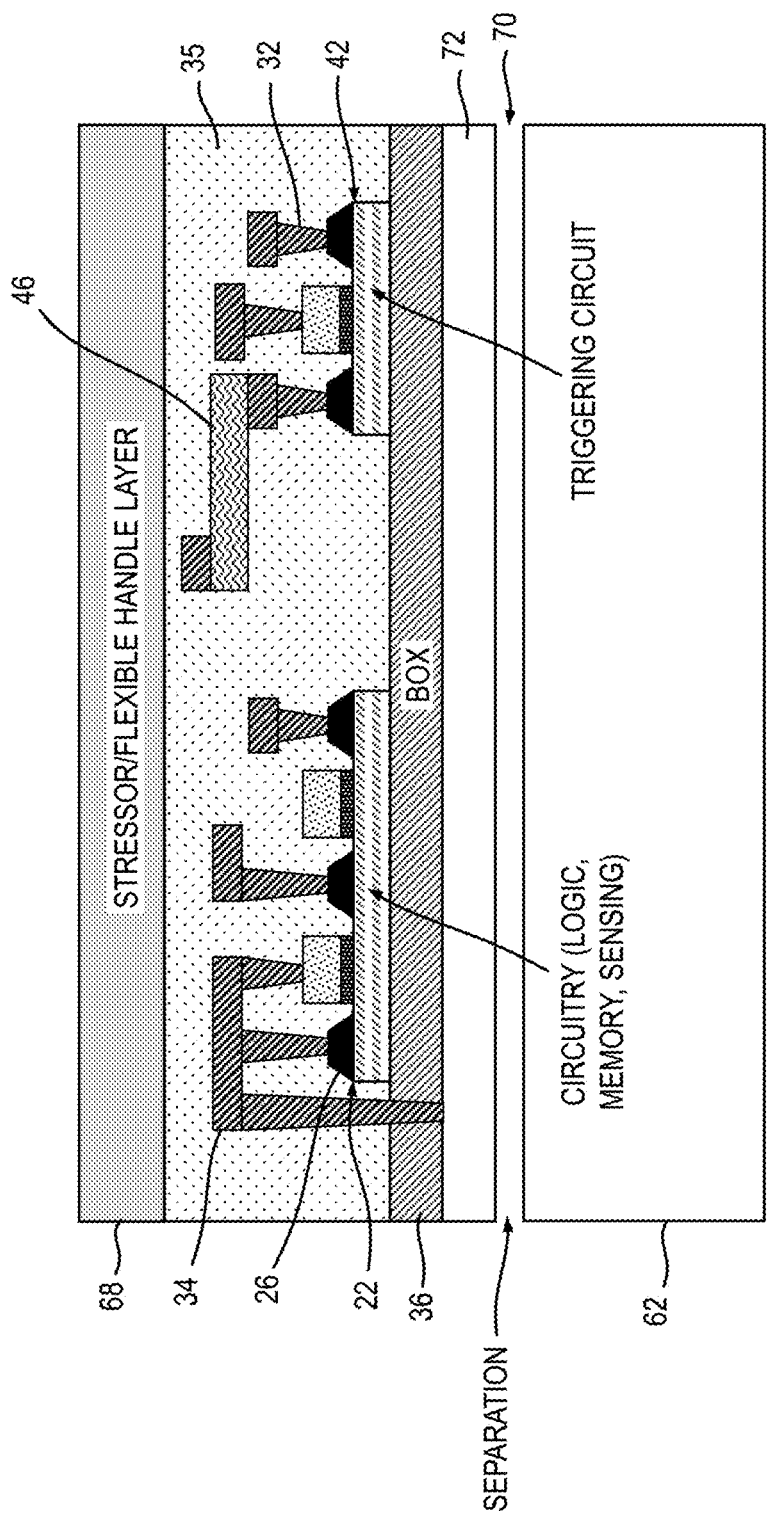
Figure 7:
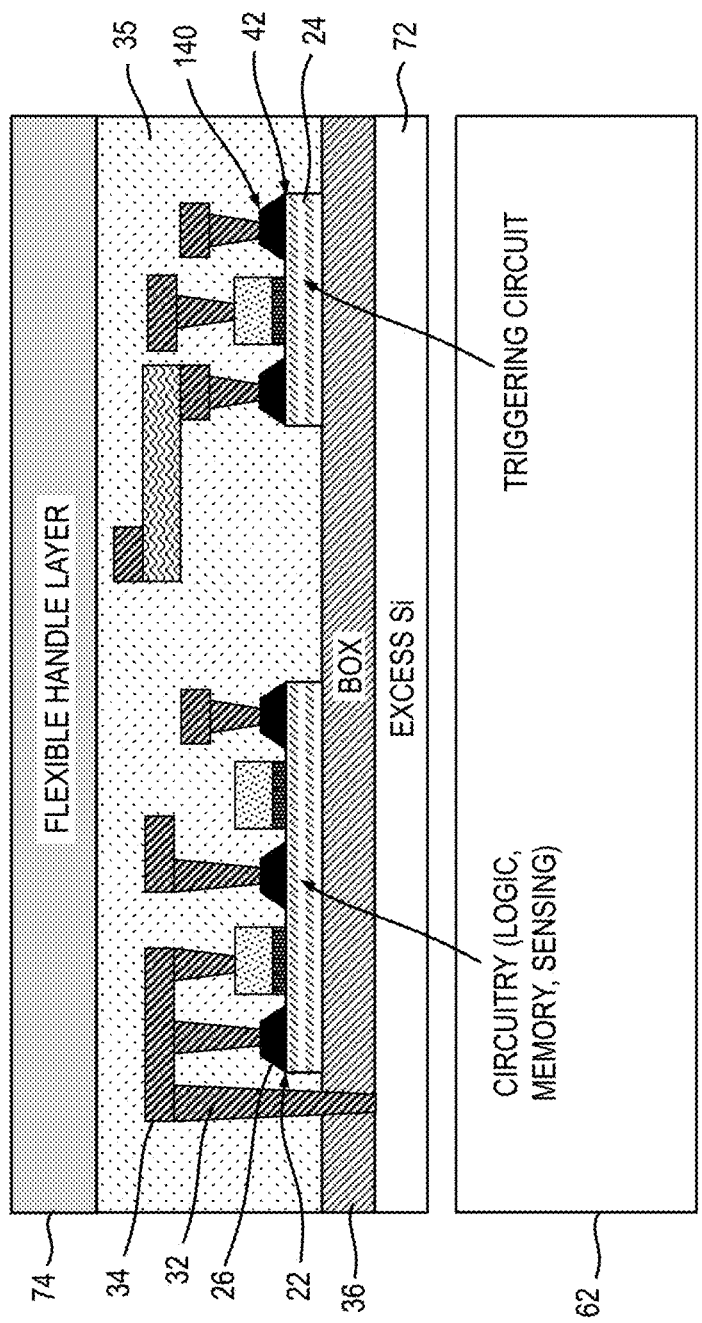

Referring to FIGS. 6 and 7, the structure obtained following BEOL processing is thinned by removing a portion of the substrate 62. One exemplary method for making a thin wafer is shown in FIG. 6. This method involves the attachment of a stressor layer and a flexible handle layer to the substrate, both of which are designated by numeral 68. The process of stress-induced, controlled spalling is described in U.S. Pat. No. 8,247,261, which is incorporated by reference herein. A stress-induced fracture 70 allows the substrate 62 to be separated from the remaining structure, leaving a thin residual substrate layer 72. Alternatively, the substrate 62 is removed by grinding. A flexible handle layer 74, for example polyimide tape, thermal releasable tape, or UV-releasable tape, is attached to the structure prior to grinding, as shown in FIG. 7. The grinding process also leaves a residual substrate layer 72.

Figure 8:
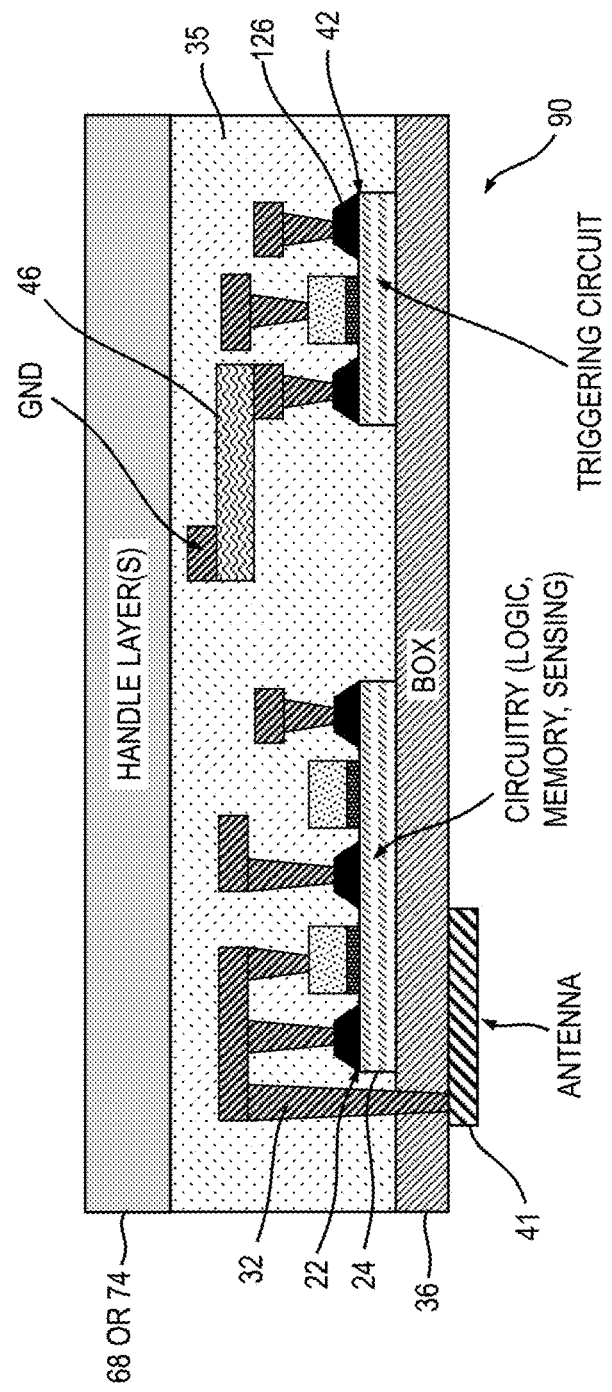

The residual substrate layer 72 is removed by selective etching down to the BOX layer 36. Wet or dry etching techniques may be employed for etching silicon. Potassium hydroxide (KOH) is an exemplary etchant for removing the residual layer 72. The optional antenna 41 is formed on the exposed surface of the BOX layer 36 by patterning and metal deposition. The structure 90 shown in FIG. 8 is thereby obtained.

Figure 9:
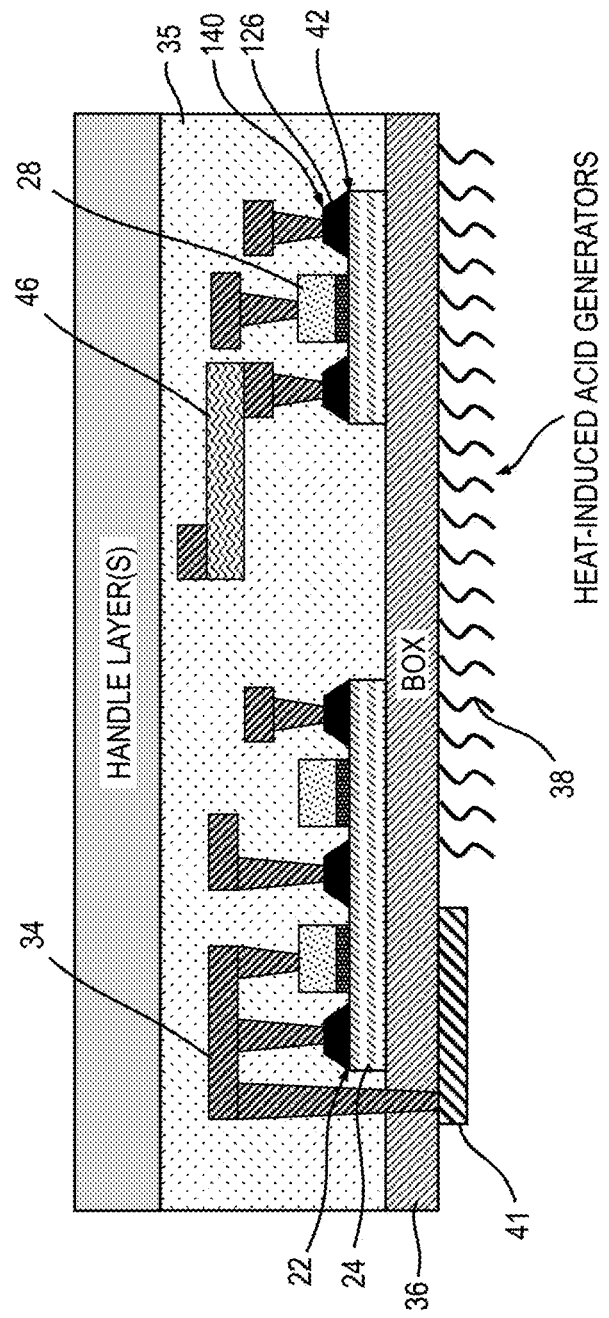

Referring to FIG. 9, the chemical layer 38 is deposited on the exposed surface of the BOX layer 36 by spin coating or other applicable process. The layer is then allowed to dry. The thickness of the deposited layer 38 depends on the amount of material above the BOX layer 36 that is to be attacked. Chemical layer thicknesses between 100 nm-20 µm can be employed in some embodiments. The encapsulation layer 40 is deposited on the structure 90 to obtain the structure 20 shown in FIG. 1. Polydimethylsiloxane (PDMS) is employed in one or more embodiments to form the encapsulation layer and can be deposited by spin coating. Spin-on glass or dissolvable polymeric sheets may alternatively be employed to form the encapsulation layer. If heat induced, acid generating chemicals as described above are employed in the chemical layer 38, they can be wetted prior to encapsulation. As discussed above, the chemical layer 38 is optional in some embodiments.

Figure 10:
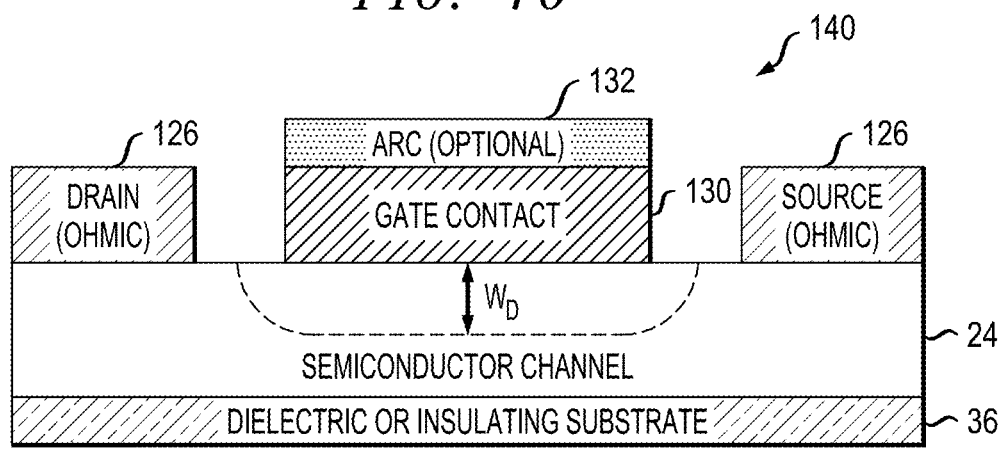
FIG. 10 is a schematic, cross-sectional view depicting operation of an exemplary photo-HJFET.

FIG. 10 illustrates a general configuration for a normally-OFF PHJFET 140 in accordance with one exemplary embodiment of the triggering circuit. The PHJFET includes a gate contact 130, source structure 126, drain structure 126, a channel formed by a portion of the thin semiconductor layer 24, and an electrically insulating layer such as the BOX layer 36. An anti-reflective coating 132 on the gate contact is 128 is optional. The source structure 126 is biased with an electric voltage which, when allowed by the activity of optical material within the gate contact, results in the flow of electric current through channel to the drain structure. The channel material is, in this embodiment, a doped layer of silicon-containing material. The source structure and drain structures 126 form ohmic contacts with the thin semiconductor film 24. In one embodiment, the channel material is one of mono-crystalline silicon (also called single-crystal silicon, mono crystalline Si, or just mono-Si) or polycrystalline silicon (also called polysilicon or poly-Si). The gate contact 130 comprises a photoelectric element that is electrically floating. (i.e. no external electrical connection is made to the gate, unlike the source and the drain). In contrast to the composition of the channel material, the composition of photosensitive material within the gate contact 130 includes hydrogenated amorphous silicon (the non-crystalline form of silicon with long-range lattice disorder). In some embodiments, the hydrogenated amorphous silicon is grown using plasma-enhanced chemical vapor deposition (PECVD) at temperatures below 400 degrees Celsius (° C.). The gate contact and channel form a photosensitive junction. In some embodiments, the gate contact includes a plurality of layers of various materials that form one or more p-n junctions, p-i-n junctions, or Schottky junctions, or combinations thereof. In some embodiments, the gate contact and channel form a p-n junction, a p-i-n junction, or a Schottky junction. As known in the art, a p-i-n junction includes interfaces between an un-doped intrinsic semiconductor region that is between a p-type semiconductor region and an n-type semiconductor region. A p-n junction includes an interface between a p-type semiconductor and an n-type semiconductor region. The term "n-type" refers to the addition of impurities that contribute free electrons to an intrinsic semiconductor. In a silicon containing substrate, examples of n-type dopants, i.e. impurities, include but are not limited to antimony, arsenic and phosphorous. The term "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. A Schottky junction generally refers to a metal-semiconductor junction. In many cases, when the semiconductor is n-type, the metal layer is chosen to have a higher workfunction than the semiconductor material, and when the semiconductor is p-type, the metal layer is chosen to have a lower workfunction than the semiconductor material. In some embodiments, an organic material is between the metal and an inorganic semiconductor to form a "hybrid" Schottky junction. For example, in one embodiment, the gate contact 130 includes a top layer of gold (which is a high-workfunction metal analogous to a p-type material used as the "p" layer) and a bottom layer of pentacene, which form a "hybrid" Schottky junction with an inorganic channel material (the "n" layer), which in one embodiment is comprised of Si. In another embodiment, the gold layer is comprised of a grid rather than a continuous film to allow better light transmission into pentacene. In another embodiment, a substantially transparent high workfunction polymer such as PEDOT (Poly(3,4-ethylenedioxythiophene)) or PEDOT:PSS (Poly(3,4-ethylenedioxythiophene):Polystyrene sulfonate) is used instead of the gold layer. For example, in one embodiment, the gate contact 130 includes a stack of organic layers that includes a layer of pentacene on top of channel and a layer of passivation material between the pentacene and channel. For example, such a passivation material may include a layer of 9,10-phenanthrenequinone (PQ), or a mono-layer of long-chain alcohols or thiols). In some embodiments, one or both of passivation layers and transport/blocking layers (i.e., electron transport/hole-blocking materials) are included as part of gate contact. One or more material layers included in the gate contact 130 are configured to absorb photons and generate electron-hole pairs in response.

The level of reflection of silicon, if employed in the gate contact 130, is reduced by texturing and/or by applying anti-reflection coating(s) (ARCs) 132 to the surface of the silicon that may be exposed to illumination upon tampering with the chip of a structure in which the chip is incorporated. In some embodiments, the texturing is applied to the surface of the ARC. ARCs may consist essentially of a thin layer of dielectric material with a specially chosen thickness that reduces reflection. For example, the ARC 132 in some embodiments is a thin layer of one of the following i) hydrogenated amorphous silicon oxide (a-SiO$_x$:H), ii) hydrogenated amorphous silicon nitride (a-SiN$_x$:H), or titanium oxide (TiO$_2$). In other embodiments, the ARC 132 includes one or more of silicon nitride (Si$_3$N$_4$), aluminum oxide (Al$_2$O$_3$), silicon dioxide (SiO$_2$), zinc-oxide (ZnO), and tantalum oxide (Ta$_2$O$_5$). Such coatings are often formed using PECVD, sputtering or atomic-layer deposition (ALD). In some embodiments, the ARC may be comprised of a transparent conductive oxide such as indium-tin-oxide (ITO) or aluminum-doped zinc-oxide (ZnO:Al), even though the ARC is not required to be electrically conductive.

In operation and with reference to the device 140 shown in FIG. 10, a "floating" junction between the gate contact 130 and the underlying channel has a built-in potential, $V_{bi}$. The depletion region width, $W_D$, is a function of $V_{bi}^{1/2}$. Illumination creates an additional voltage $V_{oc}$ in addition to $V_{bi}$. Under illumination, $W_D$ is proportional to $[V_{bi}-V_{oc}]^{1/2}$. If the thickness of the semiconductor (t) is chosen properly to assure the device is off in the absence of light, i.e. $W_D \geq t$ in the dark, the device can switch from OFF to ON (as shown in FIG. 10) with illumination. Illumination may include visible or non-visible light. In some embodiments, the gate contact material may have a volatile or non-volatile memory effect (e.g. temporary or permanent, partially or fully irreversible structural change with illumination); such a memory effect is not required. Examples of such materials include but not limited to photochromic compounds and select chalcogenides.

Figure 11:
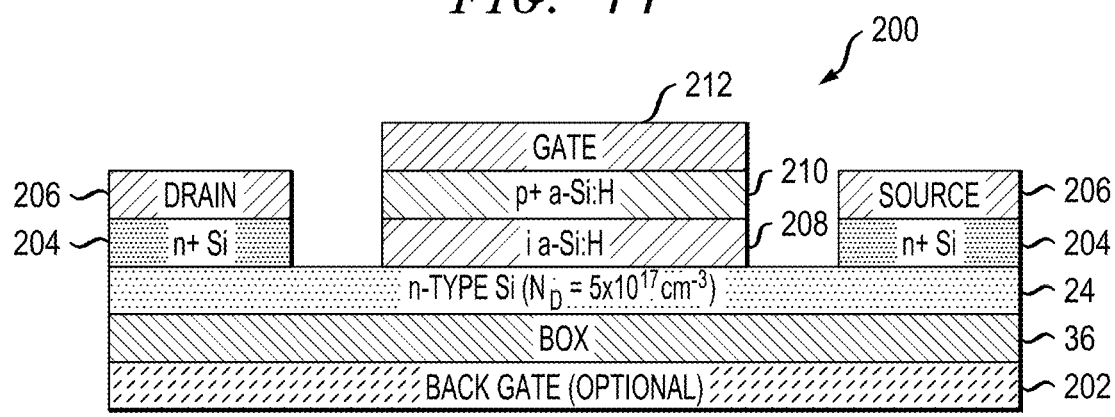
FIG. 11 is a schematic, cross-sectional view depicting an exemplary photo-HJFET.

An exemplary photo-HJFET device 200 including a hydrogenated amorphous silicon (a-Si:H) stack in the gate heterojunction is shown in FIG. 11. The transistor includes an optional back gate 202 that adjoins a BOX layer 36. A crystalline silicon layer 24 directly contacts the electrically insulating (BOX) layer. Gate, drain and source regions are grown on the thin silicon layer 24 using PECVD techniques at less than 200° C. In the exemplary embodiment, the source and drain regions include n+ silicon layers 204 and adjoining metal layers 206. The gate region includes an intrinsic amorphous hydrogenated silicon (i a-Si:H) layer 208, a p+ amorphous hydrogenated silicon layer on the intrinsic amorphous hydrogenated silicon layer, and a metal layer 212 on the p+ amorphous hydrogenated silicon layer. In embodiments where the transistor falls short of being entirely normally-OFF, the pinch-off voltage ($V_p$) can be modulated by the back gate 202 to improve transistor performance. The back gate is a layer of electrically conductive material that is connected to a power supply (not shown) such that electrical voltage can be applied to control the flow of current through the channel. Exemplary materials from which the back gate can be formed include but are not limited to copper, aluminum, silver, gold, gallium, titanium and combinations thereof.

As discussed above, the photo-HJFET 200 can be formed at process temperatures less than 200° C. and is therefore compatible with back-end-of-line (BEOL) processing and plastic substrates. Deposition and patterning of the drain and source regions on the semiconductor layer 24 may be performed by depositing a doped or undoped semiconductor layer on the semiconductor layer 24, preferably using a low temperature deposition process. Examples of low temperature deposition processes include PECVD and hot wire CVD. The layer deposited on the semiconductor layer 24 may include single-crystal or polycrystalline silicon is some exemplary embodiments. Non-crystalline source and drain regions may alternatively be formed. The deposited layer may be doped or partially doped in situ or doped following deposition and patterning. Implantation and diffusion doping are two exemplary doping techniques that can be employed in place of or supplemental to in situ doping. In some embodiments, a silicon layer is selectively deposited on the semiconductor layer 24. Gas sources such as silane (SiH$_4$), disilane, dichlorosilane (DCS), tetrafluorosilane and combinations thereof may be employed using, for example, a plasma enhanced CVD process. In situ n-type doping may be provided by using a phosphine (PH$_3$) gas source. In one exemplary embodiment, epitaxial growth of silicon on the semiconductor layer 24 is performed in a hydrogen diluted silane environment using PECVD. The gas ratio of hydrogen to silane ([H$_2$]/[SiH$_4$]) at 150° C. is between 0 to about 1,000, Epitaxial growth of silicon begins at a gas ratio of about 5-10. The epitaxial silicon quality is improved by increasing the hydrogen dilution to five or greater. Radio-frequency (RF) or direct current (DC) plasma enhanced chemical vapor deposition can be performed at deposition temperatures from about room temperature to about 400° C., and preferably from about 150-200° C. Plasma power density may range from about two mW/cm$^2$ to about 2,000 mW/cm$^2$. A deposition pressure range is about ten mTorr to about five Torr. After deposition, the deposited layer is patterned using lithographic masking and etching techniques to obtain the drain and source regions. As discussed above, etching is further performed to pattern the semiconductor layer 24 and form active regions conforming to the dimensions of the photo-HJFETs and any other thin-film transistors to be formed using the semiconductor layer 24.

Upon exposure of photosensitive material to a sufficient amount and/or type of illumination, a voltage bias is generated across the floating junction formed between the photosensitive material and the channel material. This voltage bias modulates the width ($W_D$) of the depletion region formed inside the semiconductor layer 24, which in turn modulates the current that flows from source to drain. In the normally-OFF devices discussed herein, the channel is pinched-off at zero gate bias and a positive gate bias is needed to turn on (un-pinch) the channel. In the exemplary embodiment of FIG. 11, a combination of amorphous and mono-crystalline silicon/poly-crystalline silicon layers are used to provide high sensitivity to light levels/wavelengths as well as high-drive current when the device is exposed to sufficient illumination. In general, the amorphous silicon layers 208, 210 are used to provide high sensitivity to light levels/wavelengths while the mono-crystalline silicon/poly-crystalline silicon layer 24 is used to provide an effective pathway to conduct the high-drive current.

Hydrogenated amorphous and microcrystalline silicon are typically deposited by plasma-enhanced chemical vapor deposition (PECVD) although other techniques such as hot-wire chemical vapor deposition (HWCVD) may be used as well. Doping of the p+ a-Si:H layer 210 is in situ in some embodiments. The n+ hydrogenated crystalline silicon (c-Si: H) source and drain regions 204 can be grown epitaxially using the same PECVD reactor used to form the amorphous layers 208, 210 at temperatures close to 200° C. The intrinsic layer 208 functions, primarily, as a surface passivation layer to reduce the minority carrier recombination and therefore junction leakage by saturating the dangling bonds on the surface of the n-type c-Si channel. The highly doped p+ a-Si:H layer 210 has a conductivity type opposite to that of channel, which is n-type in some exemplary embodiments.

In some embodiments, materials other than a-Si:H may be used to form one or both of the layers 208, 210. Examples include hydrogenated amorphous germanium (a-Ge:H), hydrogenated amorphous silicon carbide (a-SiC:H), hydrogenated amorphous silicon germanium (a-SiGe:H), or combinations thereof. In addition, the nano-crystalline or microcrystalline forms of the above mentioned semiconductors or combinations thereof may also be used. These layers may contain nitrogen (N), oxygen (O), fluorine (F), deuterium (D), chlorine (Cl) or combinations thereof. These materials are typically grown by plasma-enhanced chemical vapor deposition (PECVD), however, other growth techniques known in the art, such as hot-wire CVD (HWCVD) or sputtering may be used as well. In the case of PECVD or HWCVD, the gas source used for growing Si containing layers is typically silane ($SiH_4$) although other gases such as disilane ($Si_2H_6$), dichlorosilane (DC S), tetrafluorosilane ($SiF_4$) or combinations thereof may be used as well. These gas sources are typically (but not necessarily) mixed with hydrogen during growth. The gas source used for Ge containing layers is typically germane ($GeH_4$). The gas source used for C containing layers is typically methane ($CH_4$), ethylene ($C_2H_4$), propylene ($C_3H_6$) but other sources (typically of the form $C_xH_y$) may be used as well. In-situ p-type doping is typically performed using diborane ($B_2H_6$) or trimethylboron (TMB) sources and in-situ n-type doping is typically performed using phosphine ($PH_3$) gas source, although other dopant sources may be used as well. Ammonia ($NH_3$), nitrous oxide ($N_2O$) or other gas sources may be used for nitrogen containing layers. Carbon dioxide ($CO_2$), $N_2O$ or $O_2$ may be used to provide oxygen for oxygen containing layers. A carrier gas such as hydrogen ($H_2$), deuterium ($D_2$) helium (He) or argon (Ar) may be used for any or all of the layers. The carrier gas may be pre-mixed with the gas sources or flowed simultaneously with the gas source at the time of growth. Growth temperatures are typically close to 200° C., with highest quality films typically grown at temperatures in the range of 150-250° C. However, growth temperatures in the range of room-temperature to 450° C. may be used.

In some embodiments, materials other than c-Si:H may be used to form the source and drain regions. Examples include c-SiGe:H, c-Ge:H and c-SiC:H. The gas sources used for the growth of the hydrogenated crystalline Si, Ge (and SiGe) may include but not limited to $SiH_4$ (silane), $GeH_4$ (germane) (and combination thereof) and $H_2$. Other examples of Si containing gas sources are $Si_2H_6$ and $SiF_4$. Typically the gas flow ratio $[H_2]/([SiH_4]+[GeH_4])>5$. The dopant gases (flowed in-situ) may include but are not limited to $PH_3$ (phosphine) for n-type doping, and $B_2H_6$ (diborane) or TMB (tri-methyl-boron) for p-type doping. These layers may contain nitrogen (N), oxygen (O), fluorine (F), deuterium (D), chlorine (Cl) or combinations thereof. The preferred technique for growing these materials is plasma-enhanced chemical vapor deposition (PECVD), however, other growth such as hot-wire CVD (HWCVD) may be used. The PECVD tool may use RF or microwave power supplied and may or may not have a remote-plasma configuration. Growth temperatures are typically close to 200° C., with highest quality films typically grown at temperatures in the range of 150-250° C. However, growth temperatures in the range of room-temperature to 450° C. may be used.

The exemplary photo-HJFET 200 includes a metal layer 206 on each layer of heavily doped, n-type hydrogenated crystalline silicon (n+ c-Si:H) 204. The n+ c-Si:H layers are heavily doped with one or more of phosphorus and arsenic in some exemplary embodiments. In one or more embodiments, the active doping concentration $N_D$ exceeds $10^{20}$ $cm^{-3}$. In general, in this embodiment, the hydrogenated crystalline silicon-containing layers 204 contain between five to forty atomic percent hydrogen. The metal layers 206 can be formed of the same metal(s) used to form the back gate 202.

It will be appreciated that the gate stacks and associated source/drain regions of the structures disclosed herein are tailored to the particular type(s) of TFTs to be formed. In some TFTs, the gate stacks include the intrinsic and doped hydrogenated amorphous silicon layers that provide photosensitivity to light. Conventional RF-PECVD techniques can be employed to deposit both layers. Gate stacks for other types of TFTs, such as the MOSFET devices included in the electronic circuitry 22 shown in FIG. 1, may include high-k gate dielectric layers (not shown) and electrically conductive gate materials on the gate dielectric layers. In one or more embodiments, the gate dielectric layers comprise a high-dielectric constant (high-k) insulating material, such as, for example, hafnium oxide (HfO2), tantalum oxide (Ta2O5), or dual-layer silicon dioxide (SiO2)/high-k film. The gate dielectric layers, if employed, may be formed using a deposition technique such as atomic layer deposition (ALD), CVD, sputtering, or the like, although other methods of forming the layers are similarly contemplated. Dielectric spacers (not shown) are formed on the gate stacks.

Figure 12:
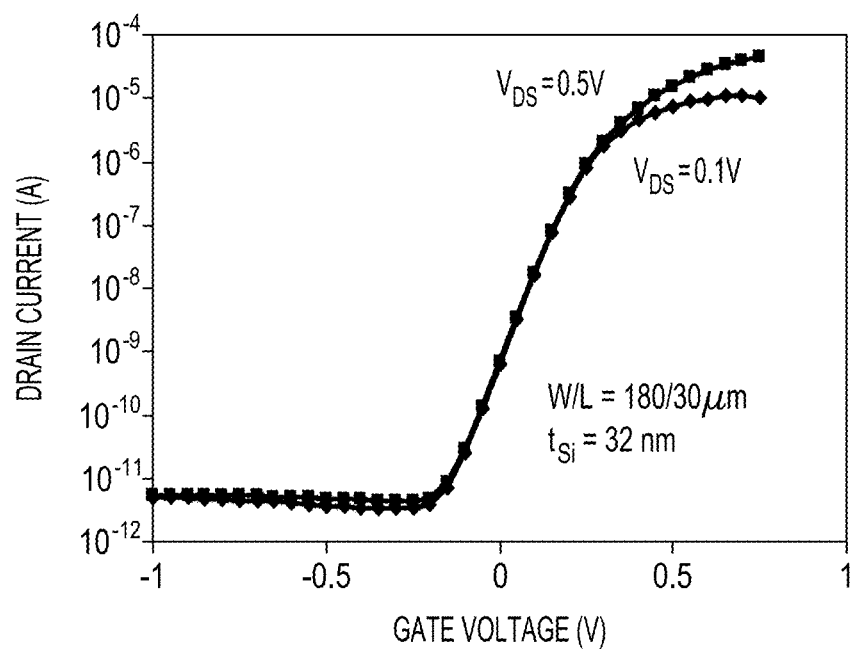
FIG. 12 is a first graph showing drain current as a function of gate voltage for an exemplary photo-HJFET having certain dimensions.
Figure 13:
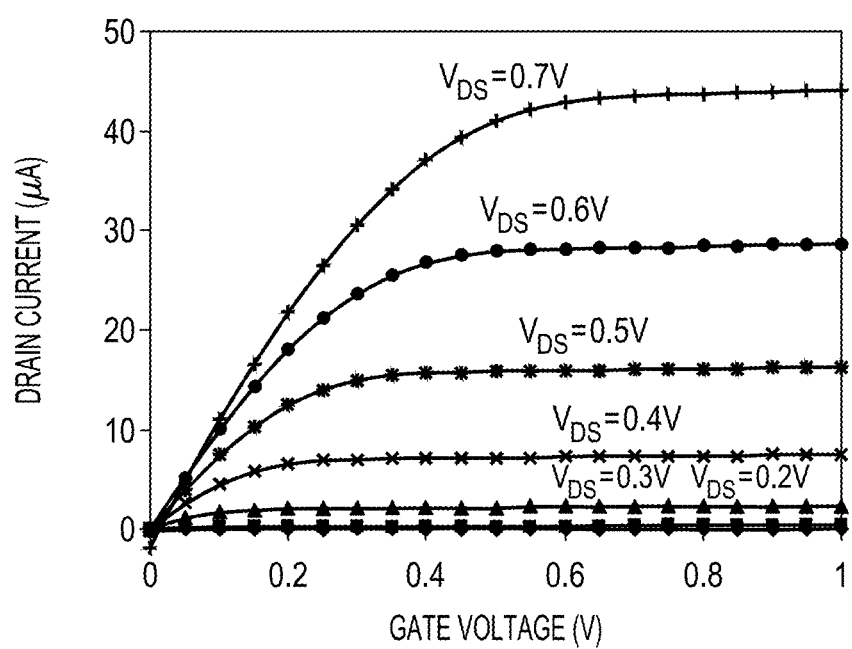
FIG. 13 is a second graph showing drain current (in micro-amps) as a function of gate voltage for the exemplary photo-HJFET.
Figure 14:
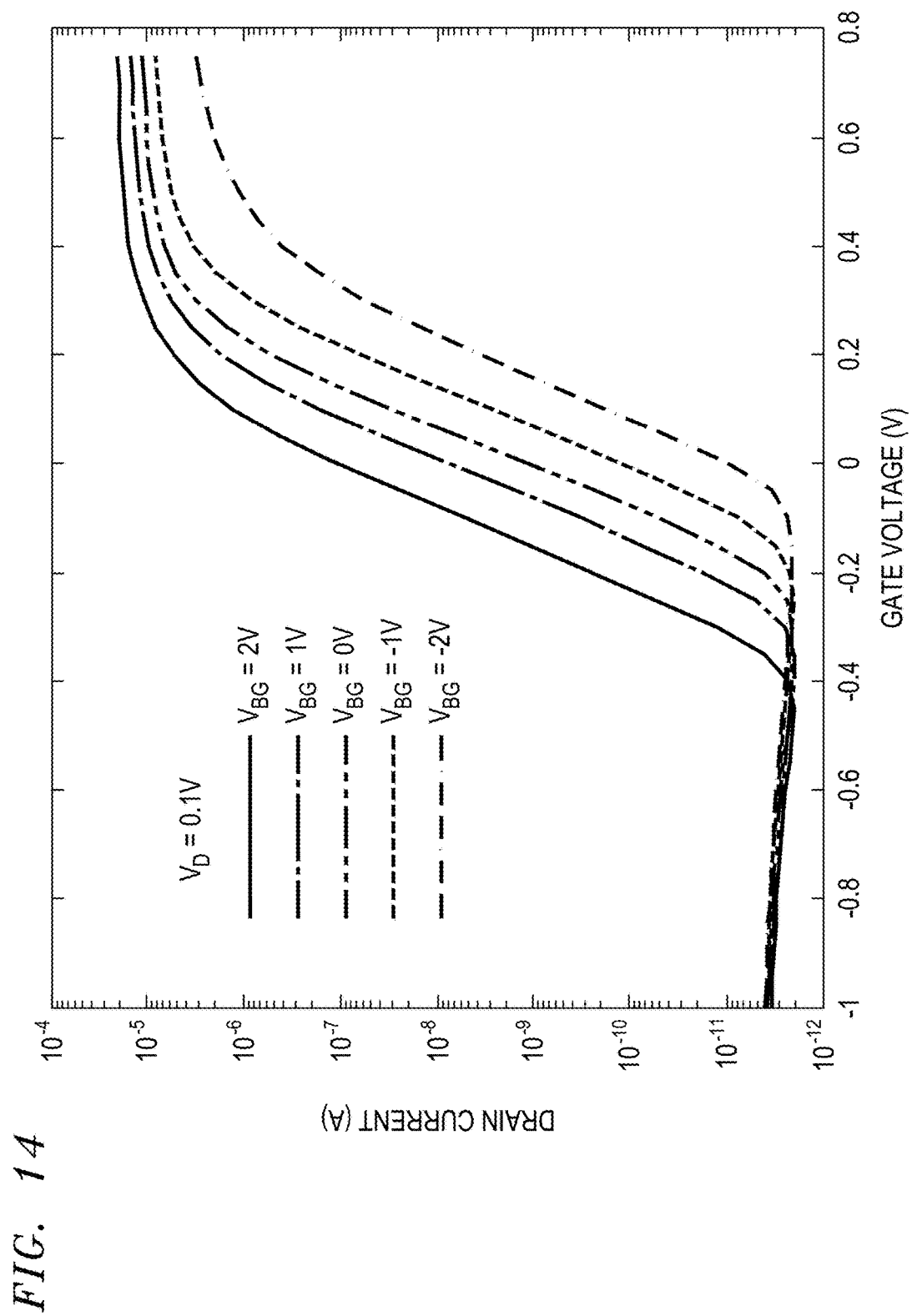
FIG. 14 is a third graph showing drain current as a function of gate voltage for the exemplary photo-HJFET as modulated by back-gate voltage.
Figure 15:
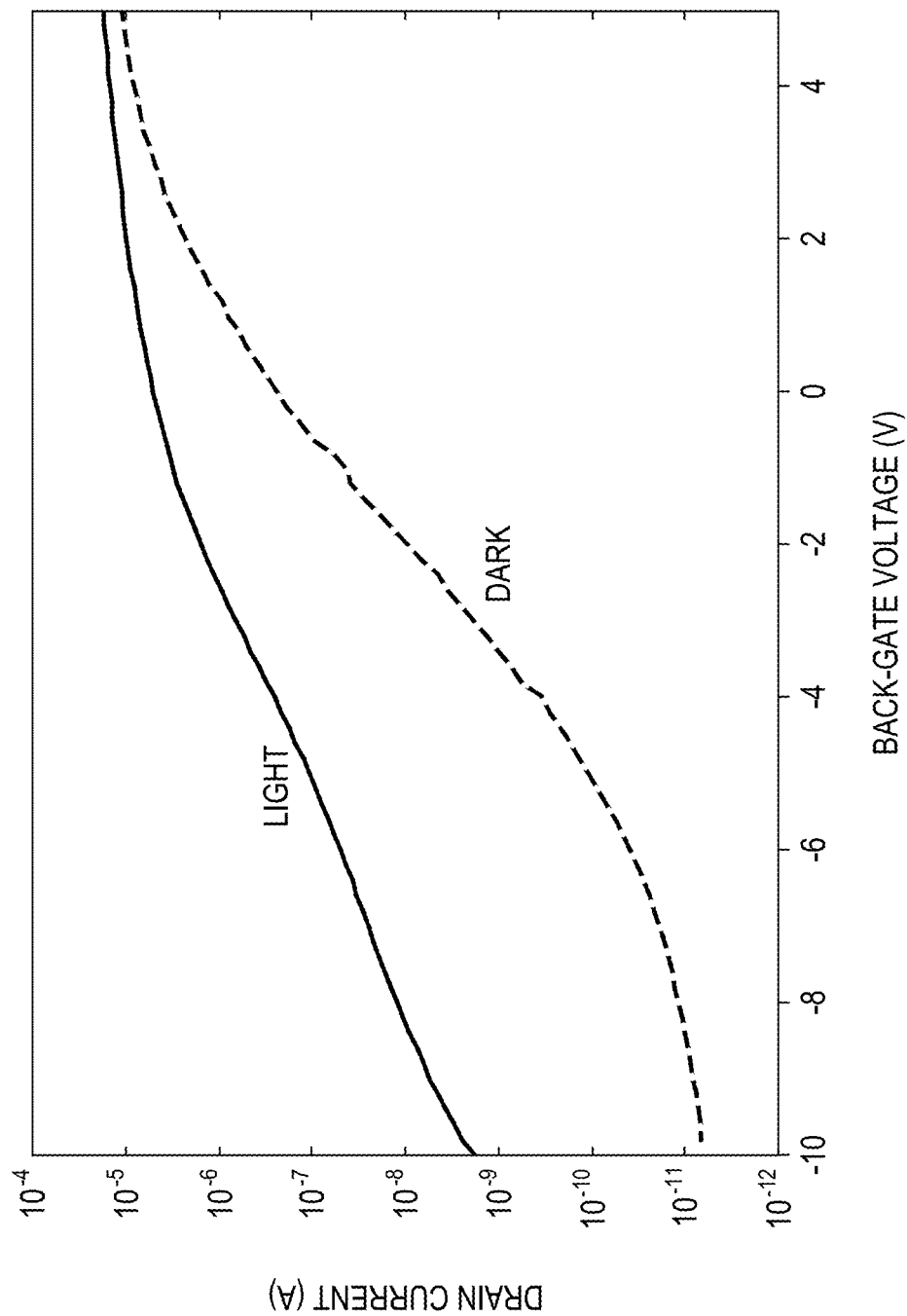
FIG. 15 is a graph showing drain current as a function of back-gate voltage for the exemplary photo-HJFET under light and dark conditions.

FIGS. 12 and 13 show the drain current measured in the dark (i.e. under no illumination) as a function of gate voltage for a normally-OFF heterojunction field-effect photo-transistor substantially as described with respect to FIG. 11. The gate electrode 212 is comprised of a conductive material thus allowing the application of a bias to the gate for the purpose of characterizing the PH-JFET in the dark. As explained earlier, conductivity is not a requirement for the gate electrode as the gate electrode is electrically floating (not biased) during PH-JFET operation. The exemplary transistor has width/length dimensions of 180/30 microns. The n-type silicon layer 24 had a doping concentration of $5 \times 10^{17}$ $cm^{-3}$ and a thickness of thirty-two nanometers. While the transistor has a positive pinch-off voltage ($V_p \approx 0.2V$), it is not completely turned off (i.e. in the subthreshold regime) at $V_G=0V$ and a negative gate voltage of at least ~–0.2V is needed to completely turn off the transistor. A transistor which is completely turned off at $V_G=0V$ requires a larger $V_p$ (>0.4V in this example) which can be achieved by a smaller doping concentration and/or a thinner c-Si substrate. Alternatively, the pinch-off voltage can be increased by applying a negative voltage to the back gate 202, as demonstrated by the graph in FIG. 14 showing drain current as a function of gate voltage for a number of back gate voltages (both positive and negative). FIG. 15 is a graph showing drain current as a function of back gate voltage. Direct current characteristics under light and dark conditions are illustrated, showing modulation of the device current with light of the normally-OFF heterojunction field-effect photo-transistor. While sufficient sensitivity of the exemplary device is obtained for the transient electronic schemes described herein, sensitivity can be improved with lower channel doping levels and/or thinner channel film layers to reduce the dark current. The transient response of this exemplary PH-HJFET was measured using a red pulsed laser, indicating rise and fall times of the order of ~1 μs and ~10 μs, respectively (not shown). While such rise and fall times are sufficient for the anti-tampering schemes disclosed herein, they can be reduced if desired. The rise time may be reduced by reducing the channel length of the device. The fall time may be reduced by reducing the minority carrier lifetime, e.g. by creating deep electronics states in the c-Si layer e.g. by metal implantation, or using material with a lower crystalline quality and/or higher defect density, e.g. poly-Si instead of mono-Si.

Figure 16:
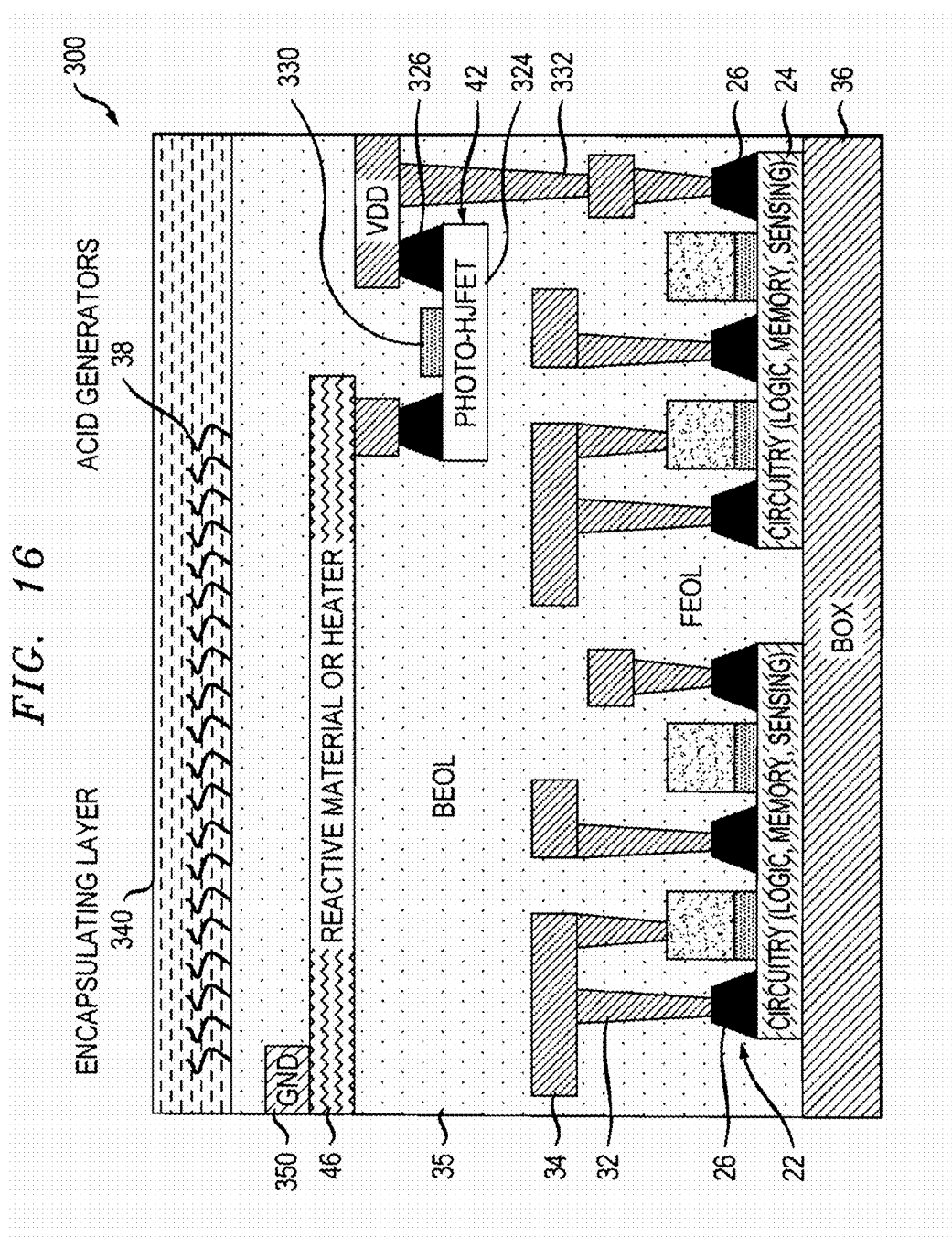
FIG. 16 is a schematic, cross-sectional view depicting a second exemplary integrated circuit.

FIG. 16 shows a further exemplary structure 300 wherein the triggering circuit 42, including the normally-OFF heterojunction field-effect photo-transistor, is formed during back-end-of-line (BEOL) fabrication of the structure 300. In contrast, the triggering circuit 42 is formed during the same fabrication stage (FEOL) as the electronic circuitry in the structure shown in FIG. 1. (The same reference numerals are used in both FIGS. 1 and 16 to designate similar structures.) As described above, the normally-OFF heterojunction field-effect photo-transistors described above with respect to FIGS. 10 and 11 are amenable to fabrication at temperatures below 400° C., making them back-end compatible. Specifically, fabrication of such normally-OFF, silicon-based heterojunction field-effect photo-transistors is possible without damaging the back-end metal (e.g. copper) interconnects that are also formed during the BEOL stage. Electronic circuitry 22 is formed using, for example, conventional CMOS fabrication technology on the semiconductor layer 24 that adjoins the buried oxide (BOX) layer 36. The circuitry 22 is formed prior to formation of the normally-OFF heterojunction field-effect photo-transistor as part of a front-end-of-line (FEOL) fabrication stage. The dielectric layer 35 can be deposited as multiple layers, one of which provides a surface for growing the semiconductor layer 324 used as the channel region for the photo-HJFET that forms part of the triggering circuit 42. As discussed above, a crystalline semiconductor layer can be grown using chemical vapor deposition from gaseous or liquid precursors or deposited as an amorphous material by sputtering or PECVD followed by laser crystallization. Crystalline source/drain regions 326, which are formed from heavily doped hydrogenated crystalline silicon in some embodiments, can be formed using PECVD or HWCVD. Dopant gases are flown in situ. The gate structure 330 in some embodiments is formed of layers of intrinsic amorphous silicon (a-Si:H) and heavily doped hydrogenated amorphous silicon as described above. The technique(s) employed for forming the semiconductor layer and other elements of the photo-HJFET are preferably chosen to allow for fabrication at a temperature below 400° C. Conventional metallization techniques can be employed to form via conductors and other electrical connectors 32, 34, 332. The supply voltage $V_{DD}$ powers both the photo-HJFET and the electronic circuitry 22 in one or more embodiments. The heating element or light source 46 is electrically connected between the photo-HJFET and ground 350. A chemical layer 38 and an encapsulating layer 340 are formed on the dielectric layer 35. Polydimethylsiloxane (PDMS) is employed in one or more embodiments to form the encapsulation layer and can be deposited by spin coating. Spin-on glass or dissolvable polymeric sheets may alternatively be employed to form the encapsulation layer 340. If heat induced, acid generating chemicals as described above are employed in the chemical layer 38, they can be wetted prior to encapsulation. As discussed above, element 46 may comprise chemically reactive materials capable of generating sufficient heat to destroy all or part of the structure 300 upon illumination of the photo-HJFET, in which case the chemical layer 38 and encapsulation layer 340 may be optional. It will be appreciated that an integrated circuit may contain photo-HJFETs formed at different levels, for example during both FEOL and BEOL stages, to enhance tamper-detection ability.

The layers of material described in these embodiments are formed, in general, from the lowest layers up to the top-most layers. There are many known techniques of semiconductor device manufacturing which can be combined to form the structures disclosed herein. In general, a layer of material is first deposited and then is etched to form structures from the deposited material. This process depositing material and then etching it is repeated until the device has been completed. Elements such as electrical wires and filler materials have been excluded from some illustrated embodiments. The elements of and methods of formation of such structures are known in the art and therefore have been omitted for brevity in the description and simplification of the drawings.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, a chemical oxide removal (COR) etching, and reactive ion etching (REI), which are all known techniques to remove select material when forming a semiconductor structure. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1*st* Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 3:
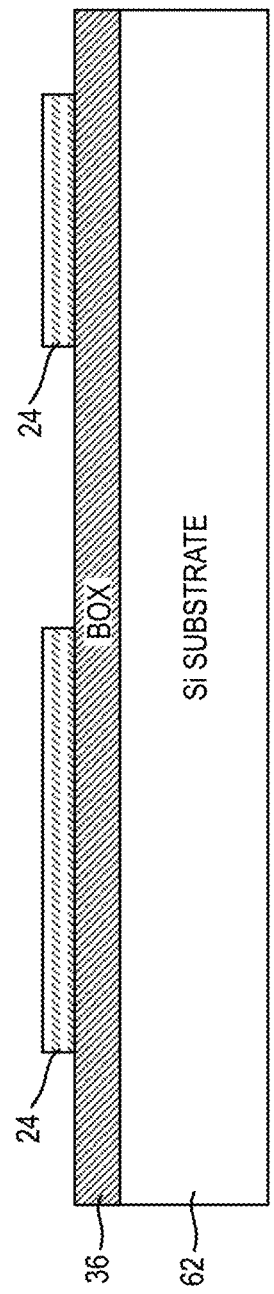

Given the discussion thus far, it will be appreciated that, in general terms, an exemplary fabrication method includes obtaining a structure including a semiconductor layer and an electrically insulating layer adjoining the semiconductor layer. An exemplary structure 60 including semiconductor and insulating layers 24, 36 is shown in FIG. 3. Electronic circuitry 22 is formed on the semiconductor layer 24 using, for example, CMOS fabrication techniques. A triggering circuit 42 including a normally-OFF heterojunction field-effect photo-transistor is formed on the structure. A reactive layer is formed on the structure. The reactive layer may be: 1) corrosive to the electronic circuitry, 2) capable of generating a material corrosive to the electronic circuitry upon activation, 3) capable of generating gas upon activation, or capable of generating sufficient heat to disable the electronic circuitry. The reactive layer is further responsive to current flow through the normally-OFF heterojunction field-effect photo-transistor when subjected to light and configured for disabling the electronic circuitry when a reaction is triggered. An encapsulation layer (40 in FIG. 1, 340 in FIG. 16, or alternatively the dielectric layer 35 in FIGS. 1 and 16) is formed for encapsulating the reactive layer. In some embodiments, the reactive layer is directly responsive to current from the normally-OFF heterojunction field-effect phototransistor, such as when nickel/aluminum multilayers or other materials capable of generating an exothermic reaction are electrically connected thereto. In other embodiments, the reactive layer is indirectly responsive to current flowing through the normally-OFF heterojunction field-effect photo-transistor, such as when an actuator 46 facilitates a chemical reaction in a layer within the chip that is not electrically connected to the normally-OFF heterojunction field-effect photo-transistor, such as layer 38 in FIGS. 1 and 16. The method further includes electrically connecting the heating element to ground and electrically connecting the normally-OFF heterojunction field-effect photo-transistor to a voltage source in some embodiments. In one or more embodiments, the reactive layer is comprised of acid generating material activated by heat and/or light and capable of producing one or more acids. In some embodiments, such as shown in FIGS. 1-9, the normally-OFF heterojunction field-effect photo-transistor is formed on the semiconductor layer. In other embodiments, as shown in the exemplary embodiment of FIG. 16, the electronic circuitry 22 is formed during a front-end-of-line fabrication process and the normally-OFF heterojunction field-effect photo-transistor is formed at temperature(s) below 400° C. during a back-end-of-line fabrication process such that the normally-OFF heterojunction field-effect photo-transistor is positioned above the electronic circuitry 22. It will be appreciated that the photosensitive FETs can be formed on multiple levels within an integrated circuit. In some embodiments, the normally-OFF heterojunction field-effect photo-transistor includes a crystalline (monocrystalline or polycrystalline) semiconductor channel, highly doped crystalline source and drain regions 204 having a first conductivity type on the channel, and a photosensitive gate stack including an intrinsic semiconductor layer 208 adjoining the channel and a highly doped semiconductor layer 210 on the intrinsic semiconductor layer, the highly doped semiconductor layer having a second conductivity type opposite to the first conductivity type. The source and drain regions in some embodiments consist essentially of hydrogenated crystalline silicon and the photosensitive gate stack consists essentially of amorphous hydrogenated silicon. The fabrication method further includes embedding the normally-OFF heterojunction field-effect photo-transistor(s) to shield it (them) from light under normal operating conditions. An opaque layer is formed on the chip in some embodiments. Should an attempt be made to access the electronic circuitry following fabrication, the gate stack of the photo-transistor will be exposed to light, causing current to flow to the actuating element 46. Such current flow results in partial or complete chip destruction using one or more of the techniques described herein.

Further given the above discussion, an integrated circuit is provided that includes a structure including a semiconductor layer and an electrically insulating layer having a top surface and a bottom surface. The semiconductor layer adjoins the top surface of the electrically insulating layer. Electronic circuitry 22 is on the semiconductor layer 24. The integrated circuit further includes a triggering circuit 42 including a normally-OFF heterojunction field-effect phototransistor. A reactive layer, for example layer 38 or a layer comprising element 46, on the structure is directly or indirectly reactive to current flowing through the normally-OFF heterojunction field-effect photo-transistor. The reactive layer is configured for disabling the electronic circuitry. In some embodiments, the normally-OFF heterojunction field-effect photo-transistor includes a crystalline semiconductor channel, the source/drain regions include highly doped semiconductor layers having first conductivity type on the channel, and the photosensitive gate region includes an intrinsic semiconductor layer adjoining the channel and a highly doped semiconductor layer on the intrinsic semiconductor layer. The highly doped semiconductor layer has a second conductivity type opposite to the first conductivity type. The source/drain regions in some embodiments consist essentially of hydrogenated silicon, the photosensitive gate region consists essentially of amorphous hydrogenated silicon, and the channel consists essentially of polycrystalline silicon. In some embodiments, a back gate is operatively associated with the normally-OFF heterojunction field-effect photo-transistor, as schematically illustrated in FIG. 11. A voltage source $V_{DD}$ is electrically connected to the normally-OFF heterojunction field-effect photo-transistor and a ground terminal 350 is electrically connected to the reactive layer in some embodiments, as schematically illustrated in FIG. 16.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having devices therein that will be partially or completely destroyed should there be attempts to tamper with them.

An integrated circuit in accordance with aspects of the present disclosure can be employed in essentially any application and/or electronic system where partial or complete destruction of a portion or portions of the system would be beneficial under certain circumstances. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. An integrated circuit comprising:
 a structure including a first semiconductor layer and an electrically insulating layer having a top surface and a bottom surface, the first semiconductor layer adjoining the top surface of the electrically insulating layer;
 electronic circuitry on the first semiconductor layer;
 a dielectric layer on the structure;
 a second semiconductor layer within the dielectric layer;
 a triggering circuit including a normally-OFF heterojunction field-effect photo-transistor on the structure, the normally-OFF heterojunction field-effect photo-transistor including source/drain regions and a photosensitive gate region adjoining the second semiconductor layer;
 a heating or light emitting element electrically connected to the normally-OFF heterojunction field-effect photo-transistor, and
 a reactive chemical layer configured for disabling the electronic circuitry, the reactive chemical layer being directly or indirectly reactive to current flowing through the normally-OFF heterojunction field-effect photo-transistor and the heating element or light source.

2. The integrated circuit of claim 1, wherein the electronic circuitry comprises CMOS circuitry.

3. The integrated circuit of claim 2, wherein the heating or light emitting element comprises the reactive chemical layer.

4. The integrated circuit of claim 1, further including a voltage source electrically connected to the normally-OFF heterojunction field-effect photo-transistor and a ground terminal electrically connected to the heating or light emitting element.

5. The integrated circuit of claim 1, wherein the normally-OFF heterojunction field-effect photo-transistor includes a crystalline semiconductor channel, the source/drain regions including highly doped semiconductor layers having first conductivity type on the channel, the photosensitive gate region including an intrinsic semiconductor layer adjoining the channel and a highly doped semiconductor layer on the intrinsic semiconductor layer, the highly doped semiconductor layer having a second conductivity type opposite to the first conductivity type.

6. The integrated circuit of claim 5, wherein the source/drain regions consist essentially of hydrogenated silicon and the photosensitive gate region consists essentially of amorphous hydrogenated silicon.

7. The integrated circuit of claim 6, wherein the channel consists essentially of polycrystalline silicon.

8. The integrated circuit of claim 6, further including a back gate operatively associated with the normally-OFF heterojunction field-effect photo-transistor.

9. The integrated circuit of claim 1, further including an encapsulating layer on the dielectric layer, the reactive chemical layer being within the encapsulating layer.

* * * * *